(12) United States Patent
Nakajima

(10) Patent No.: US 8,238,731 B2
(45) Date of Patent: Aug. 7, 2012

(54) LIGHT-EMITTING HEAT TREATMENT APPARATUS

(75) Inventor: Toshihiro Nakajima, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 828 days.

(21) Appl. No.: 12/395,940

(22) Filed: Mar. 2, 2009

(65) Prior Publication Data

US 2009/0245761 A1 Oct. 1, 2009

(30) Foreign Application Priority Data

Mar. 25, 2008 (JP) ................................. 2008-077130

(51) Int. Cl.
*A21B 2/00* (2006.01)
(52) U.S. Cl. .................... 392/416; 392/422; 392/426
(58) Field of Classification Search .................. None
See application file for complete search history.

(56) References Cited

U.S. PATENT DOCUMENTS

| | | | | |
|---|---|---|---|---|
| 3,836,751 A * | 9/1974 | Anderson | ...................... | 219/411 |
| 4,533,820 A * | 8/1985 | Shimizu | ........................ | 219/411 |
| 4,649,261 A * | 3/1987 | Sheets | ........................... | 219/390 |
| 5,236,295 A * | 8/1993 | Ishii et al. | ................. | 414/222.07 |
| 5,414,244 A * | 5/1995 | Imahashi | ...................... | 219/497 |
| 5,482,558 A * | 1/1996 | Watanabe et al. | ............. | 118/728 |
| 5,592,581 A * | 1/1997 | Okase | ........................... | 392/418 |
| 6,042,372 A * | 3/2000 | Sakata et al. | ................ | 432/241 |
| 6,315,512 B1 * | 11/2001 | Tabrizi et al. | ................. | 414/217 |
| 6,454,863 B1 * | 9/2002 | Halpin | ........................... | 118/725 |
| 6,849,831 B2 * | 2/2005 | Timans et al. | ................ | 219/390 |
| 6,869,485 B2 * | 3/2005 | Halpin | ........................... | 118/725 |
| 6,951,996 B2 * | 10/2005 | Timans et al. | ................ | 219/390 |
| 7,034,255 B2 * | 4/2006 | Murayama | ..................... | 219/390 |
| 7,381,928 B2 * | 6/2008 | Kusuda et al. | ................ | 219/411 |
| 7,501,607 B2 * | 3/2009 | Camm et al. | .................. | 219/679 |
| 7,745,762 B2 * | 6/2010 | Timans | ........................ | 219/390 |
| 7,973,266 B2 * | 7/2011 | Nakajima et al. | ............. | 219/521 |
| 2003/0053893 A1 * | 3/2003 | Matsunaga et al. | ........... | 414/217 |
| 2006/0174981 A1 * | 8/2006 | Tsuji et al. | ..................... | 148/559 |
| 2008/0116196 A1 * | 5/2008 | Nakajima et al. | ............. | 219/521 |
| 2009/0197403 A1 * | 8/2009 | Honda et al. | .................. | 438/585 |
| 2009/0325393 A1 * | 12/2009 | Miyoshi et al. | ............... | 438/795 |
| 2011/0031111 A1 * | 2/2011 | Kobayashi | ............... | 204/192.34 |

FOREIGN PATENT DOCUMENTS

| | | |
|---|---|---|
| JP | 2003-017430 | 1/2003 |
| WO | WO 03/085343 | 10/2003 |
| WO | WO 2004/038777 | 5/2004 |
| WO | WO 2005/124840 | 12/2005 |

* cited by examiner

*Primary Examiner* — Thor Campbell
(74) *Attorney, Agent, or Firm* — Ostrolenk Faber LLP

(57) ABSTRACT

Annular reflecting rings are removably mounted on the upper and lower sides of a chamber side portion of a chamber. An annular recessed portion is formed sandwiched between the lower end face of the upper reflecting ring and the upper end face of the lower reflecting ring to surround a holding part for holding a semiconductor wafer. The outer peripheral surface of the recessed portion communicates with a transport opening. The formation of the recessed portion prevents the light emitted from halogen lamps and flash lamps from being non-uniformly reflected around the holding part to enter a semiconductor wafer, thus improving the uniformity of the in-plane temperature distribution in the semiconductor wafer during heat treatment.

8 Claims, 8 Drawing Sheets

F I G. 3
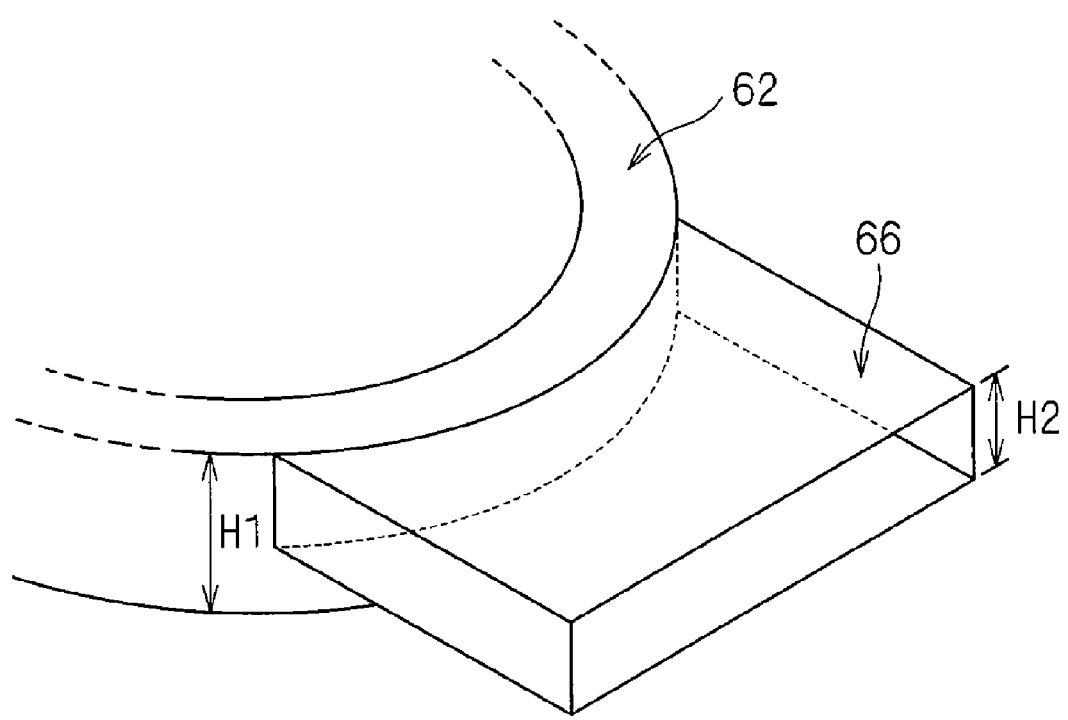

F I G. 4
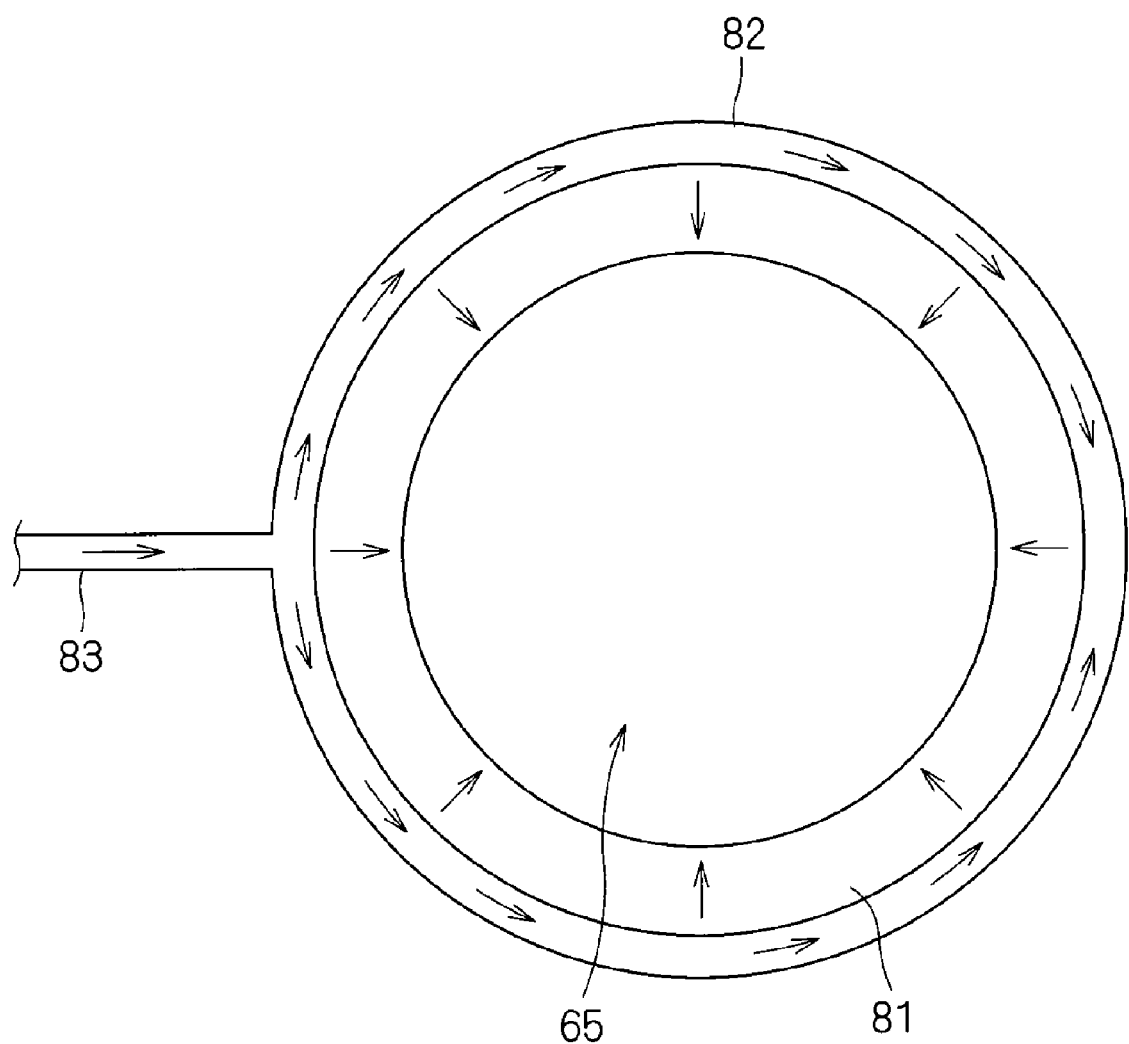

F I G . 7
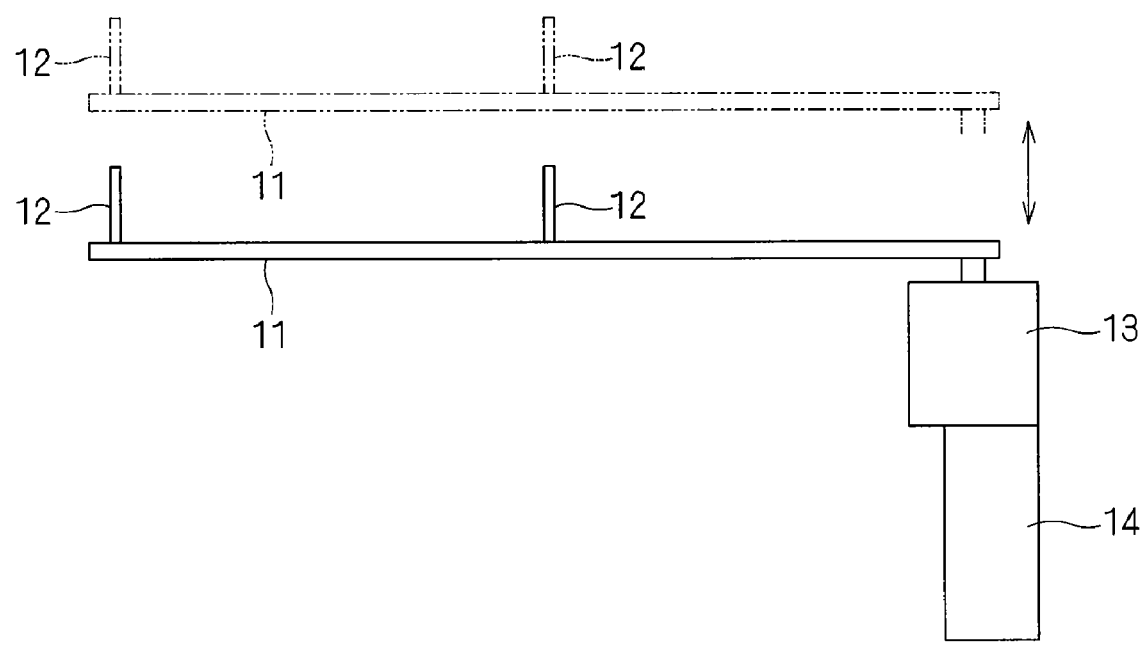

LIGHT-EMITTING HEAT TREATMENT APPARATUS

BACKGROUND OF THE INVENTION

1. Field of the Invention

The present invention relates to a heat treatment apparatus for heating a semiconductor wafer, a glass substrate, or other substrates by light irradiation.

2. Description of the Background Art

Conventionally, lamp annealers employing halogen lamps have been commonly used in the step of activating ions in a semiconductor wafer after ion implantation. Such lamp annealers carry out the activation of ions in a semiconductor wafer by heating (or annealing) the semiconductor wafer to a temperature of the order of, for example, 1000° C. to 1100° C. Such heat treatment apparatuses utilize the energy of light emitted from halogen lamps to raise the temperature of a substrate at a rate of about several hundred degrees per second.

In recent years, with increasing degree of integration of semiconductor devices, it has been desired that the junction be made shallower with decreasing gate length. It has turned out, however, that, even if the activation of ions in a semiconductor wafer is carried out with such a lamp annealer as described above that raises the temperature of a semiconductor wafer at a rate of about several hundred degrees per second, there occurs a phenomenon that boron, phosphorus, or other ions implanted in the semiconductor wafer are deeply diffused by heat. The occurrence of such a phenomenon gives rise to apprehension that the junction may become deeper than the desired level, hindering good device formation.

There has thus been proposed a technique for raising temperature only in the surface of an ion-implanted semiconductor wafer in an extremely short time (several milliseconds or shorter) by irradiating the surface of the semiconductor wafer with flash light, using xenon flash lamps (hereinafter simply referred to as "flash lamps"). The xenon flash lamps have a spectral distribution of radiation ranging from ultraviolet to near-infrared regions. The wavelength of the light emitted from the xenon flash lamps is shorter than that of the light emitted from conventional halogen lamps, and it almost coincides with a fundamental absorption band of a silicon semiconductor wafer. Thus, when a semiconductor wafer is irradiated with the flash light emitted from the xenon flash lamps, it is possible to rapidly raise the temperature of the semiconductor wafer, with only a small amount of light transmitted through the semiconductor wafer. It has also turned out that the flash light emitted within an extremely short time of several milliseconds or shorter allows a selective temperature rise only near the surface of a semiconductor wafer. That is, the extremely short temperature rise by the xenon flash lamps allows the ion activation without deep diffusion of ions.

As an example of the heat treatment apparatus employing the xenon flash lamps, U.S. Pat. No. 4,649,261 and WO 03/085343 disclose heat treatment apparatuses that carry out desired heat treatment by the combined use of pulsed-light-emitting lamps, such as flash lamps, located on the front side of a semiconductor wafer, and continuously-illuminated lamps, such as halogen lamps, located on the underside. The heat treatment apparatuses disclosed in U.S. Pat. No. 4,649,261 and WO 03/085343 raise the temperature of a semiconductor wafer, first to a certain level by using the halogen or other lamps and then to a desired processing temperature by pulse heating from the flash lamps.

In the mechanism for heating by light irradiation from both sides of a semiconductor wafer, temperature uniformity is greatly affected by the shape of the inner wall of a chamber for receiving the semiconductor wafer. Specifically, since neither the light emitted from halogen lamps nor the light emitted from flash lamps are collimated light, the light is partly reflected off the inner wall of the chamber to enter the semiconductor wafer. Thus, if the inner wall surface of the chamber is non-uniform along the circumference of the semiconductor wafer, the reflected light entering the semiconductor wafer becomes non-uniform, which results in a non-uniform in-plane temperature distribution in the wafer.

It is, however, an absolute necessity for the chamber to have a transport opening for transporting a semiconductor wafer therein and thereoutside, so that the inner wall surface of the chamber is essentially non-uniform at the location of the transport opening. The transport opening is formed not annularly along the circumference of the semiconductor wafer but only in part of the chamber. This causes another problem that the portion of a semiconductor wafer that is opposed to the transport opening with no side wall will have a lower temperature than the other portion because of a small amount of incident light thereon, which results in a non-uniform in-plane temperature distribution in the semiconductor wafer.

SUMMARY OF THE INVENTION

The present invention is directed to a heat treatment apparatus for heating a substrate by light irradiation.

According to an aspect of the invention, the heat treatment apparatus includes: a chamber having a tube-like inner wall with upper and lower openings; a holding part for holding a substrate in a horizontal position within the chamber; a first light-irradiation part provided on the upper side of the chamber and for irradiating the substrate held by the holding part with light; a second light-irradiation part provided on the lower side of the chamber and for irradiating the substrate held by the holding part with light; a first chamber window for closing the upper opening of the chamber and allowing the light emitted from the first light-irradiation part to pass through into the chamber; a second chamber window for closing the lower opening of the chamber and allowing the light emitted from the second light-irradiation part to pass through into the chamber; and a transport opening formed in the side wall of the chamber and for transporting a substrate into and out of the chamber, wherein an annular recessed portion is horizontally formed in the inner wall surface of the chamber to surround the periphery of the holding part, the recessed portion having a greater width in a vertical direction than the transport opening, and the transport opening communicates with the outer peripheral surface of the recessed portion.

Since the annular recessed portion with a greater width in a vertical direction than the transport opening is horizontally formed in the inner wall surface of the chamber to surround the periphery of the holding part, and the transport opening communicates with the outer peripheral surface of the recessed portion, there exists no light-reflecting wall surface around the entire circumference of the holding part. This prevents light from being non-uniformly reflected off the inner wall surface of the chamber to enter a substrate, thus improving the uniformity of the in-plane temperature distribution in the substrate during heat treatment.

Preferably, the heat treatment apparatus further includes two annular reflecting barrier plates, the inner peripheral surfaces of which are mirror surfaces. The two reflecting barrier plates are removably mounted on the upper and lower sides of the inner side wall of the chamber with the recessed portion therebetween.

The two reflecting barrier plates can be removed for maintenance to ease the operation.

Preferably, at least either of the two reflecting barrier plates mounted on the upper and lower sides of the recessed portion has a tapered inner peripheral surface extending toward the holding part.

This allows more light emitted from the first and second light-irradiation parts to enter the peripheral portion of a substrate where a temperature decrease due to heat radiation is likely to occur, thus further improving the uniformity of the in-plane temperature distribution in the substrate during heat treatment.

Preferably, the heat treatment apparatus further includes a transfer part. The transfer includes a pair of transfer arms with an upright support pin; a horizontal movement part for horizontally moving the pair of transfer arms between a transfer position from which a substrate is transferred to the holding part, and a retracted position that does not overlap the substrate held by the holding part in plan view; and a vertical movement part for vertically moving the pair of transfer arms up and down at the transfer position to transfer a substrate to the holding part. The retracted position is situated within the interior space of the recessed portion.

Since the retracted positions of the transfer arms of the transfer part are situated within the interior space of the recessed portion, the transfer arms will never obstruct the light emission. This further improves the uniformity of the in-plane temperature distribution in the substrate during heat treatment.

Preferably, the heat treatment apparatus further includes a temperature measurement part provided within the interior space of the recessed portion and for measuring the temperature of the substrate held by the holding part.

Since the temperature measurement part is provided within the interior space of the recessed portion, it will never obstruct the light emission. This further improves the uniformity of the in-plane temperature distribution in the substrate during heat treatment and prevents the temperature measurement part from suffering damage from the light emission.

It is therefore an object of the invention to improve the uniformity of the in-plane temperature distribution in a substrate during heat treatment.

These and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a perspective view showing the relative positions of a transport opening and a recessed portion;

FIG. 4 is a plan view illustrating the supply of a into a heat treatment space;

FIG. 7 is a side view of the transfer mechanism; and

DESCRIPTION OF THE PREFERRED EMBODIMENTS

A preferred embodiment of the present invention is now described in detail with reference to the drawings.

Figure 1:
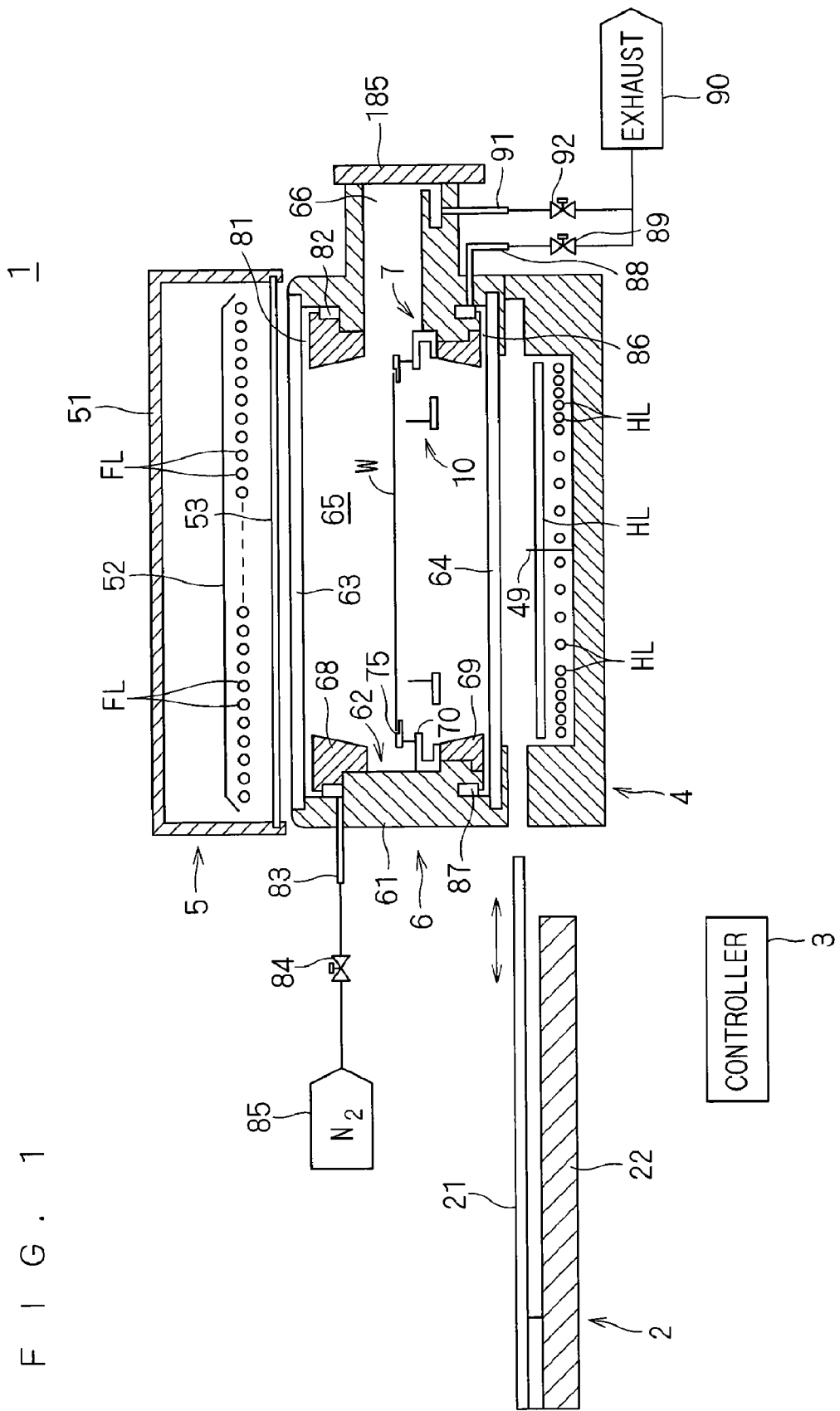
FIG. 1 is a side sectional view showing the construction of a heat treatment apparatus according to the present invention.

FIG. 1 is a side sectional view showing the construction of a heat treatment apparatus 1 according to the invention. The heat treatment apparatus 1 according to the present preferred embodiment shall be a flash lamp annealer for heating a 300 mm-diameter disc-shaped semiconductor wafer W serving as a substrate by flash-light irradiation.

The heat treatment apparatus 1 includes a chamber 6 for receiving a semiconductor wafer W therein; a flash heating part 5 with a plurality of built-in flash lamps FL; a halogen heating part 4 with a plurality of built-in halogen lamps HL; and a shutter mechanism 2. The flash heating part 5 is provided above the chamber 6, and the halogen heating part 4 below the chamber 6. The heat treatment apparatus 1 further includes, inside the chamber 6, a holding part 7 for holding a semiconductor wafer W in a horizontal position; and a transfer mechanism 10 for transferring a semiconductor wafer W between the holding part 7 and the outside of the apparatus. The heat treatment apparatus 1 further includes a controller 3 for controlling the shutter mechanism 2, the halogen heating part 4, the flash heating part 5, and each operating mechanism provided in the chamber 6 for the implementation of the heat treatment of a semiconductor wafer W.

The chamber 6 is configured by installing chamber windows made of quartz in the top and bottom of a tube-like chamber side portion 61. The chamber side portion 61 of a generally tube-like shape has upper and lower openings. The upper opening is closed with an upper chamber window 63 installed therein, and the lower opening is closed with a lower chamber window 64 installed therein. The upper chamber window 63 forming the ceiling of the chamber 6 is a disc-shaped member made of quartz and serves as a quartz window for allowing the light emitted from the flash heating part 5 to pass through into the chamber 6. The lower chamber window 64 forming the floor of the chamber 6 is also a disc-shaped member made of quartz and serves as a quartz window for allowing the light emitted from the halogen heating part 4 to pass through into the chamber 6.

A reflecting ring 68 is mounted at the upper portion of the inner wall surface of the chamber side portion 61, and a reflecting ring 69 at the lower portion. Both the reflecting rings (reflecting barrier plates) 68 and 69 are formed into an annular shape. The upper reflecting ring 68 is fitted from above the chamber side portion 61. The lower reflecting ring 69, on the other hand, is fitted from below the chamber side portion 61 and fastened with screws not shown. In other words, both the reflecting rings 68 and 69 are removably mounted to the chamber side portion 61. The interior space of the chamber 6, i.e., the space surrounded by the upper chamber window 63, the lower chamber window 64, the chamber side portion 61, and the reflecting rings 68 and 69, is defined as a heat treatment space 65.

Figure 2:
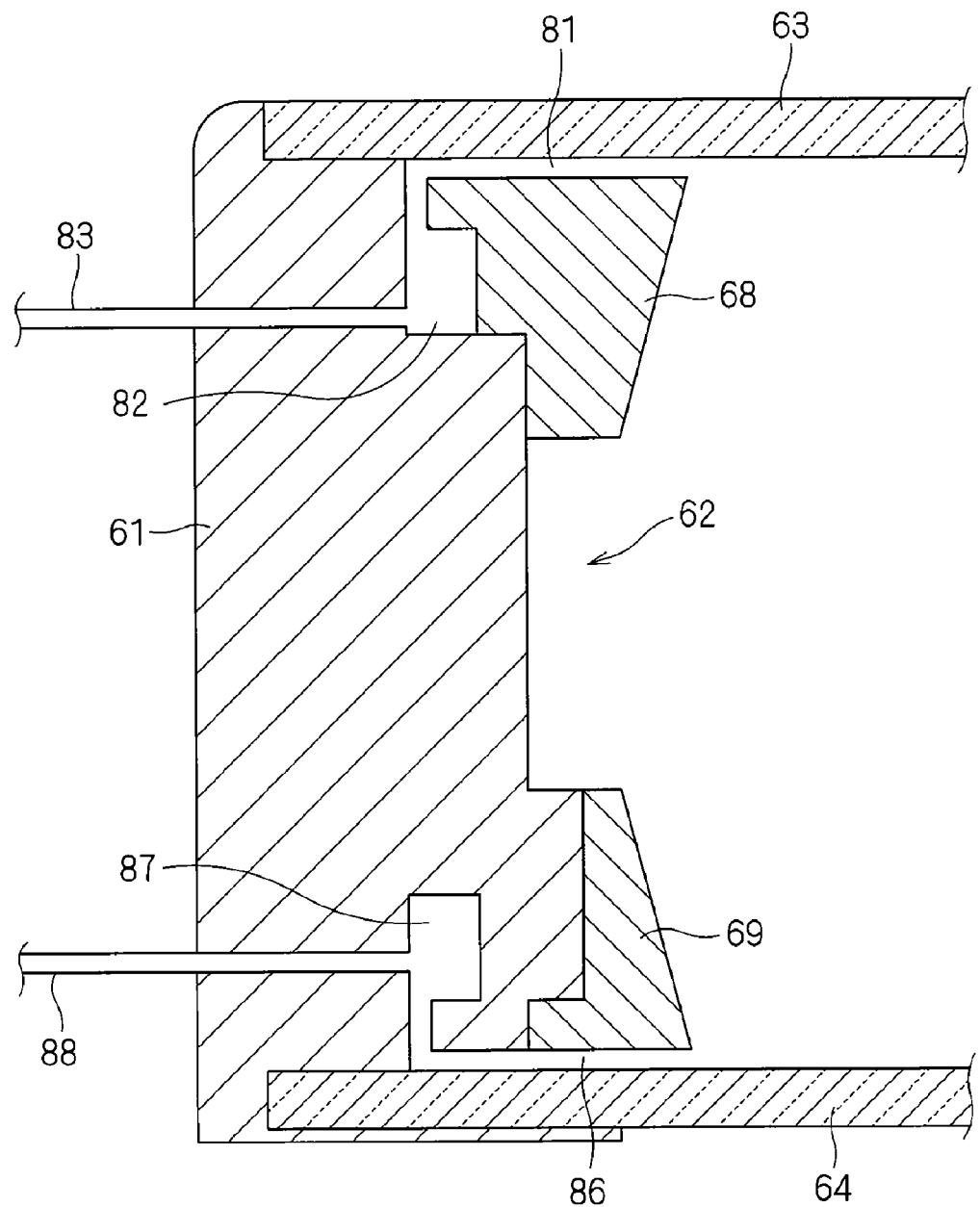
FIG. 2 is an enlarged partial sectional view of a chamber side portion.

FIG. 2 is an enlarged partial sectional view of a side portion of the chamber 6. The placement of the reflecting rings 68 and 69 at the chamber side portion 61 produces a recessed portion 62 in the inner wall surface of the chamber 6. More specifically, the recessed portion 62 formed is surrounded by the central portion of the inner wall surface of the chamber side portion 61 where the reflecting rings 68 and 69 are not placed;

the lower end face of the reflecting ring 68; and the upper end face of the reflecting ring 69. The recessed portion 62 is horizontally formed into an annular shape in the inner wall surface of the chamber 6 to surround the holding part 7 for holding a semiconductor wafer W.

As illustrated in FIG. 2, the upper and lower reflecting rings 68 and 69 with the recessed portion 62 therebetween have a tapered inner peripheral surface. The tapered surface of the upper reflecting ring 68 has a diameter that increases toward the lower side, whereas the tapered surface of the lower reflecting ring 69 has a diameter that increases toward the upper side. As illustrated in FIG. 1, the holding part 7 for holding a semiconductor wafer W is provided at the level of the recessed portion 62. Thus, both the upper reflecting ring 68 and the lower reflecting ring 69 have their tapered surfaces extending toward the holding part 7 from the quartz window sides (the upper and lower chamber windows 63 and 64).

The chamber side portion 61 and the reflecting rings 68 and 69 are made of a metallic material (e.g., stainless steel) with excellent strength and excellent heat resistance. The inner peripheral surfaces (i.e., the tapered surfaces) of the reflecting rings 68 and 69 shall be electrolytic-nickel-plated mirror surfaces.

The chamber side portion 61 is provided with a transport opening (throat) 66 for transporting a semiconductor wafer W into and out of the chamber 6. The transport opening 66 is openable and closable by a gate valve 185. When the gate valve 185 opens up the transport opening 66, a semiconductor wafer W can be transported into and out of the apparatus through the transport opening 66. When the gate valve 185 closes off the transport opening 66, the heat treatment space 65 in the chamber 6 becomes an enclosed space.

FIG. 3 is a perspective view illustrating the relative positions of the transport opening 66 and the recessed portion 62. The width H1 of the recessed portion 62 in the vertical direction (i.e., the interval between the lower end face of the reflecting ring 68 and the upper end face of the reflecting ring 69) is greater than the width H2 of the transport opening 66 in the vertical direction (i.e., the inner height of the transport opening 66). The transport opening 66 communicates with the outer peripheral surface of the recessed portion 62. Thus, when the gate valve 185 is open, a semiconductor wafer W can be transported into and out of the heat treatment space 65 is achieved through the transport opening 66 and the recessed portion 62. The width H1 of the recessed portion 62 in the vertical direction shall be in the range of 20 mm to 100 mm.

The chamber 6 is configured to supply a processing gas (in the present preferred embodiment, a nitrogen ($N_2$) gas) from the upper part of the heat treatment space 65 to exhaust a gas from the lower part. As illustrated in FIG. 2, in the upper part of the chamber 6, the reflecting ring 68 mounted to the chamber side portion 61 and the upper chamber window 63 have a gap therebetween without being arranged in close succession. Since the upper chamber window 63 is of a disc shape and the reflecting ring 68 an annular shape, the gap formed between the upper chamber window 63 and the upper end face of the reflecting ring 68 makes an annular slit 81. There is also a buffer space 82 between the chamber side portion 61 and the reflecting ring 68. The buffer space 82 is also of an annular shape and communicates with the slit 81.

The buffer space 82 communicates with a gas pipe 83. The gas pipe 83 has a root end connected to a nitrogen-gas supply source 85 (cf. FIG. 1). A valve 84 is interposed in the route of the gas pipe 83. When the valve 84 is opened, a nitrogen gas is supplied from the nitrogen-gas supply source 85 to the buffer space 82. The nitrogen gas flowing into the buffer space 82 is supplied through the slit 81 to the heat treatment space 65 in the chamber 6.

FIG. 4 is a plan view illustrating the supply of a gas into the heat treatment space 65. In the path of travel of the gas from the buffer space 82 to the slit 81, the buffer space 82 has a greater cross-sectional area of the plane that is perpendicular to the direction of travel of the gas, than the slit 81. That is, the buffer space 82 has lower fluid resistance than the slit 81. From this, as illustrated in FIG. 4, although some of the nitrogen gas flowing into the buffer space 82 from the gas pipe 83 will immediately flow into the slit 81, most will flow spreading out into the buffer space 82 which has lower resistance. Then, the nitrogen gas filling up the buffer space 82 is supplied through the slit 81 into the heat treatment space 65. The nitrogen gas is thus supplied uniformly across the entire circumference of the annular slit 81.

Also in the bottom part of the chamber 6, as in the upper part, the reflecting ring 69 and the lower chamber window 64 have a gap therebetween without being arranged in close succession. Since the lower chamber window 64 is of a disc shape and the reflecting ring 69 an annular shape, the gap formed between the lower chamber window 64 and the lower end face of the reflecting ring 69 makes an annular slit 86. The slit 86 communicates with an annular buffer space 87 formed in the chamber side portion 61. The buffer space 87 communicates with a gas pipe 88, the root end of which is connected to an exhaust part 90. A valve 89 is interposed in the route of the gas pipe 88. When the valve 89 is opened, a gas in the heat treatment space 65 is exhausted from the slit 86 through the buffer space 87 into the gas pipe 88.

Also in the path of travel of the gas from the slit 86 to the buffer space 87, the buffer space 87 has a greater cross-sectional area of the plane that is perpendicular to the direction of travel of the gas, than the slit 86. That is, the buffer space 87 has lower fluid resistance than the slit 86. The gas is thus exhausted uniformly across the entire circumference of the annular slit 86. For convenience of illustration, the gas pipes 83 and 88 show up at different positions between in FIG. 1 and in FIG. 2. However, both the gas pipes 83 and 88 may be connected to any arbitrary position in the annular buffer spaces 82 and 87. Thus, the gas pipes 83 and 88 may be connected in either way shown in FIGS. 1 and 2. Besides, both the number of gas pipes 83 connected to the buffer space 82 and the number of gas pipes 88 connected to the buffer space 87 are not limited to one, and may be any plural number. If a plurality of gas pipes 83 and a plurality of gas pipes 88 are connected at equal intervals to the buffer spaces 82 and 87, respectively, the supply and exhaust of the gas from the annular slits 81 and 86 become more uniform.

As described above, the heat treatment apparatus 1 has supply and exhaust mechanisms that are approximately symmetrical at the top and bottom to sandwich a semiconductor wafer W held in the chamber 6 therebetween. Specifically, the supply mechanism including the valve 84, the gas pipe 83, and the buffer space 82 supplies a processing gas (nitrogen gas) to the heat treatment space 65 in the chamber 6 from the slit 81 which is a gap formed annularly between the upper chamber window 63 and the upper end of the inner wall of the chamber 6. The exhaust mechanism including the valve 89, the gas pipe 88, and the buffer space 87 exhausts a gas in the chamber 6 from the slit 86 which is a gap formed annularly between the lower chamber window 64 and the lower end of the inner wall of the chamber 6. The nitrogen-gas supply source 85 and the exhaust part 90 may be either a mechanism provided in the heat treatment apparatus 1 or a utility provided in a factory where the heat treatment apparatus 1 is installed.

Figure 5:
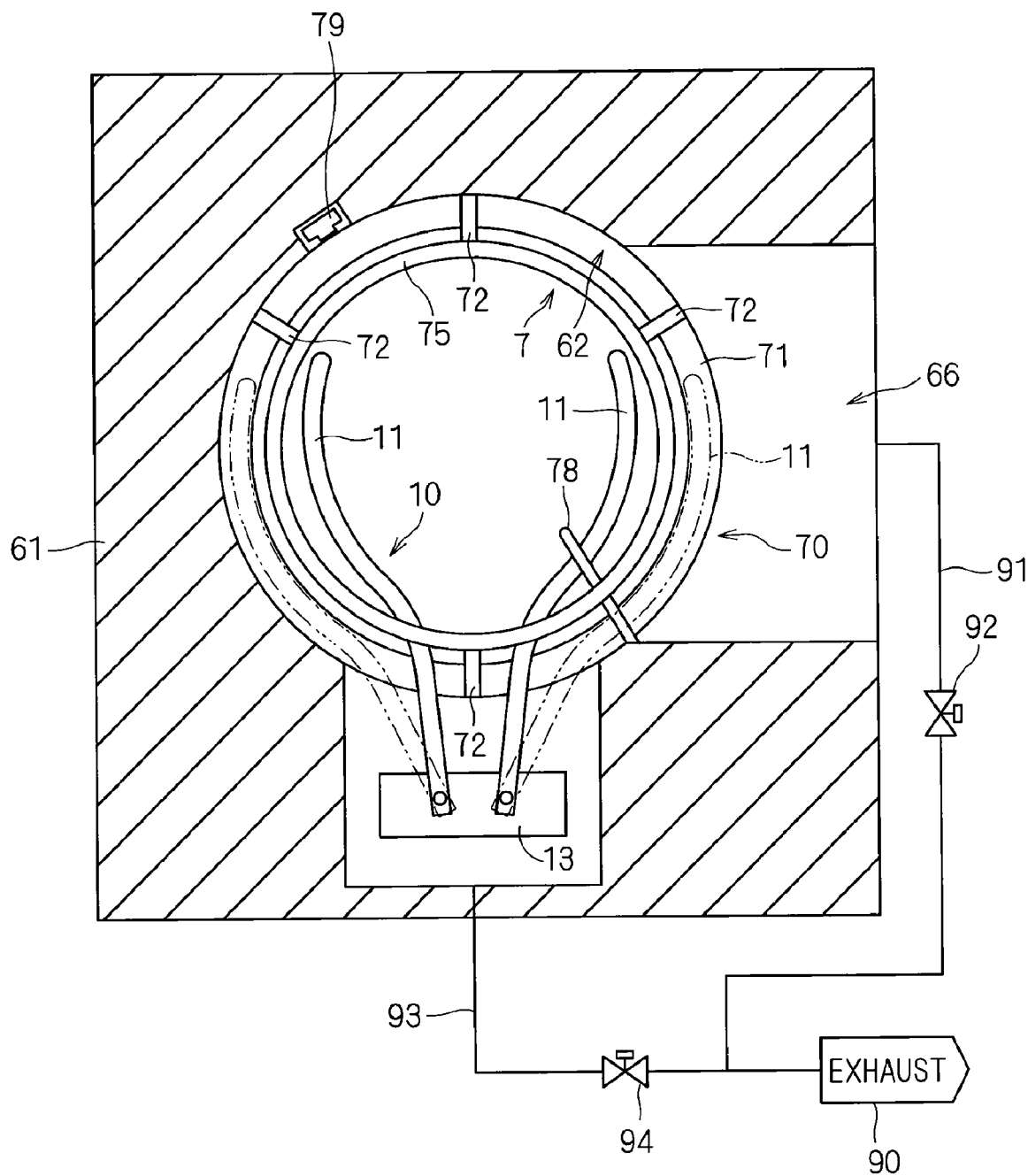
FIG. 5 is a plan view of a chamber viewed from the position for holding a semiconductor wafer.

FIG. 5 is a plan view of the chamber 6 viewed from the position for holding a semiconductor wafer W. The holding part 7 includes a susceptor 70 and a soaking ring 75. The susceptor 70 is made of quartz and includes a ring part 71 of an annular configuration and a plurality of lugs 72 (in the present preferred embodiment, four lugs) upright on the ring part 71. The ring part 71 is placed on the bottom of the recessed portion 62, so that the susceptor 70 is mounted to the chamber 6.

The soaking ring 75 is a ring-shaped member made of silicon carbide (SiC) and supported by support pins provided on the lugs 72. The soaking ring 75 has a plurality of lugs (not shown) projecting from its inner periphery. Those plurality of lugs support the peripheral portion of a semiconductor wafer W so that the semiconductor wafer W is held in a horizontal position. Instead of the plurality of lugs, collars may be provided along the inner periphery of the soaking ring 75 in order to hold a semiconductor wafer W.

Figure 6:
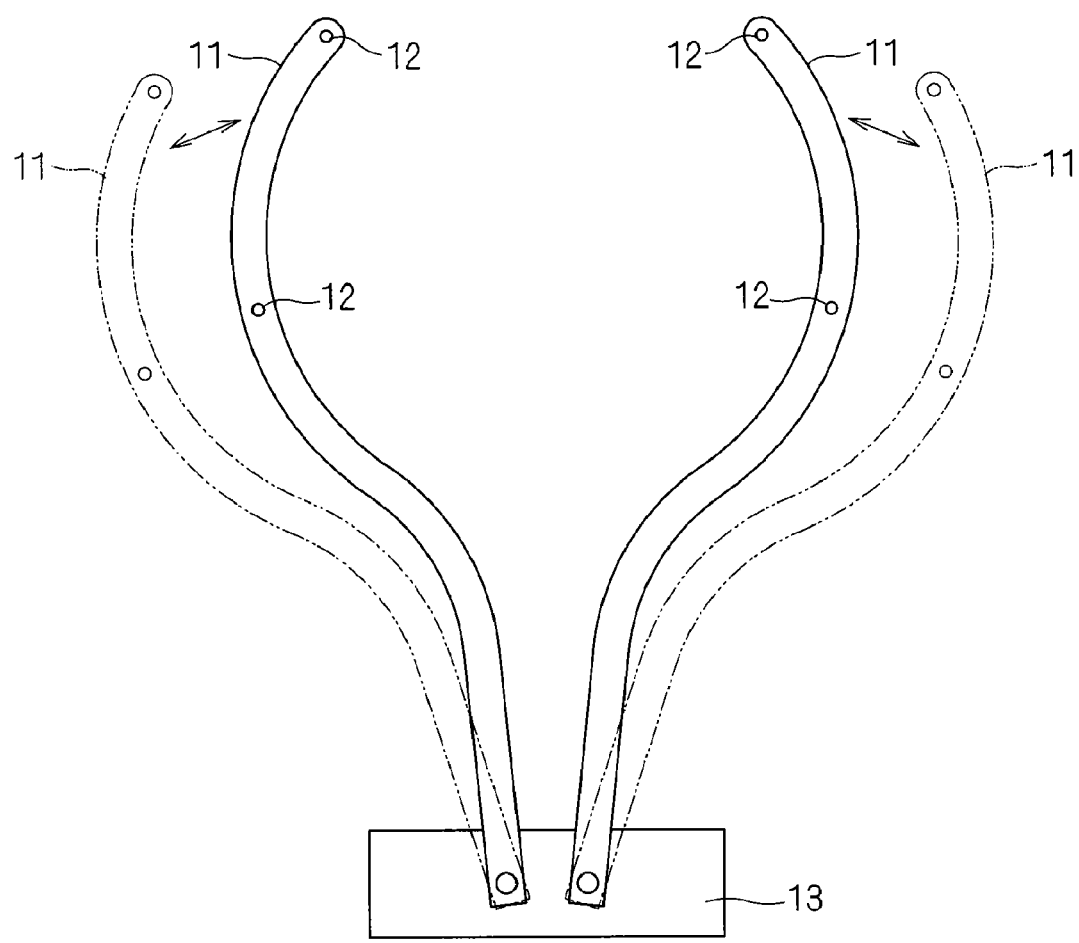
FIG. 6 is a plan view of a transfer mechanism.

FIG. 6 is a plan view of the transfer mechanism 10. FIG. 7 is a side view of the transfer mechanism 10. The transfer mechanism 10 includes two transfer arms 11. The transfer arms 11 are of an arcuate configuration extending substantially along the annular recessed portion 62. A pair of lift pins 12 are mounted upright on each of the transfer arms 11. Each transfer arm 11 is pivotable by a horizontal movement mechanism 13. The horizontal movement mechanism 13 horizontally moves the pair of transfer arms 11 between their transfer positions (indicated by the solid lines in FIG. 6), from which a semiconductor wafer W is transferred to the holding part 7, and their retracted positions (indicated by the dash-double-dot lines in FIG. 6) that do not overlap the semiconductor wafer W held by the holding part 7 in plan view. The horizontal movement mechanism 13 may be designed either to pivot each transfer arm 11 with an individual motor or to pivot the pair of transfer arms 11 in association with each other with a linkage mechanism and a single motor.

The pair of transfer arms 11, together with the horizontal movement mechanism 13, are vertically moved up and down by a vertical movement mechanism 14. When the vertical movement mechanism 14 moves up the pair of transfer arms 11 at their transfer positions, the four lift pins 12 in total pass through the inside of the soaking ring 75 so that the upper ends of the lift pins 12 protrude above the soaking ring 75. On the other hand, when the vertical movement mechanism 14 moves down the pair of transfer arms 11 at their transfer positions and the horizontal movement mechanism 13 moves the pair of transfer arms 11 to open up them, the transfer arms 11 are moved to their retracted positions.

The retracted positions of the pair of transfer arms 11 are immediately above the ring part 71 of the susceptor 70. Since the ring part 71 is placed on the bottom of the recessed portion 62, the retracted positions of the transfer arms 11 are situated within the interior space of the recessed portion 62.

As illustrated in FIG. 5, the portion of the chamber side portion 61 where a driver (the horizontal movement mechanism 13 and the vertical movement mechanism 14) of the transfer mechanism 10 is provided communicates with an exhaust pipe 93. The exhaust pipe 93 is connected to the exhaust part 90. A valve 94 is interposed in the route of the exhaust pipe 93. When the valve 94 is opened, a gas in the chamber 6 is exhausted through the periphery of the driver of the transfer mechanism 10. Another exhaust pipe 91 for exhausting a gas in the heat treatment space 65 is connected at the end of the transport opening 66. The exhaust pipe 91 is connected through a valve 92 to the exhaust part 90. When the valve 92 is opened, a gas in the chamber 6 is exhausted through the transport opening 66. While the exhaust part 90 is commonly used in three exhaust mechanisms in the present preferred embodiment, separate exhaust parts may be used instead.

As illustrated in FIG. 5, the heat treatment apparatus 1 further includes probes 78 and 79 for measuring the temperature of a semiconductor wafer W. The probe 78 of a contact-type thermometer using a thermocouple is in contact with the underside of a semiconductor wafer W held on the soaking ring 75 to measure the temperature of the semiconductor wafer W with a separate-type detector. The probe 79 of a radiation thermometer, on the other hand, receives radiation (infrared radiation) from the underside of a semiconductor wafer W held on the soaking ring 75 to measure the temperature of the semiconductor wafer W with a separate-type detector. Both the probe 78 of the contact-type thermometer and the probe 79 of the radiation thermometer are provided within the interior space of the recessed portion 62 of the chamber 6.

The heat treatment apparatus 1 further includes, as illustrated in FIG. 1, a probe 49 of a radiation thermometer in the halogen heating part 4. Like the probe 79, the probe 49 receives radiation from the underside of a semiconductor wafer W held on the soaking ring 75 to measure the temperature of the semiconductor wafer W with a separate-type detector. For wafer temperature measurement, while the probe 79 receives radiation from obliquely below the semiconductor wafer W held by the holding part 7, the probe 49 receives radiation from immediately below the semiconductor wafer W. However, the probe 49 immediately below the semiconductor wafer W is further away from the semiconductor wafer W. With those three probes 78, 79, and 49, the heat treatment apparatus 1 can reliably measure the temperature of a semiconductor wafer W.

The flash heating part 5 provided above the chamber 6 includes, inside its enclosure 51, a light source with a plurality of (in the present preferred embodiment, 30) xenon flash lamps FL; and a reflector 52 provided to cover over the light source. In the bottom of the enclosure 51 of the flash heating part 5 is installed a lamp-light radiation window 53. The lamp-light radiation window 53 forming the floor of the flash heating part 5 is a plate-like member made of quartz. The flash heating part 5 is provided over the chamber 6 so that the lamp-light radiation window 53 is opposed to the upper chamber window 63. The flash lamps FL emit flash light from above the chamber 6 through the lamp-light radiation window 53 and the upper chamber window 63 to the heat treatment space 65.

The plurality of flash lamps FL, each being a rod-shaped lamp with an elongated cylindrical configuration, are arranged in a plane so that they are parallel to each other lengthwise along the major surface of the semiconductor wafer W held by the holding part 7 (i.e., in the horizontal direction). The plane defined by such arrangement of the flash lamps FL is thus horizontal.

Each xenon flash lamp FL includes a rod-shaped glass tube (discharge tube) that contains a xenon gas sealed therein and has positive and negative electrodes provided on their opposite ends and connected to a capacitor; and a trigger electrode attached on the outer peripheral surface of the glass tube. Because the xenon gas is electrically insulative, no current will flow in the glass tube in a normal state even if the capacitor has stored an electrical charge. However, if high voltage is applied to the trigger electrode to produce an electrical breakdown, an electrical discharge between the electrodes causes the electricity stored in the capacitor to flow instantaneously into the glass tube, and the excitation of xenon atoms or molecules at that time causes light emission. Those xenon flash lamps FL have the property of being capable of emitting much intenser light than a continuously-illuminating light source such as halogen lamps HL because the electrostatic energy previously stored in the capacitor is converted into an ultrashort light pulse ranging from 0.1 millisecond to 10 milliseconds.

The reflector 52 is provided to cover over the whole of the plurality of flash lamps FL. A fundamental function of the reflector 52 is to reflect the flash light emitted from the plurality of flash lamps FL toward the holding part 7. The reflector 52 is an aluminum-alloy plate with its surface (which faces the flash lamps FL) roughened by abrasive blasting to produce a satin finish thereon.

The halogen heating part 4 provided below the chamber 6 includes a plurality of (in the present preferred embodiment, 40) built-in halogen lamps HL. The plurality of halogen lamps HL emit light from the underside of the chamber 6 to the heat treatment space 65 through the lower chamber window 64. In the present preferred embodiment, 20 halogen lamps HL are arranged in the upper row, and 20 halogen lamps HL in the lower row. Each halogen lamp HL is a rod-shaped lamp having an elongated cylindrical configuration. Both the 20 halogen lamps HL in the upper row and the 20 halogen lamps HL in the lower row are so arranged that they are parallel to each other lengthwise along the major surface of the semiconductor wafer W held by the holding part 7 (i.e., in the horizontal direction). Further, the halogen lamps HL in both the upper and lower rows are disposed at a higher density in a region facing the peripheral portion of a semiconductor wafer W held by the holding part 7 than in a region facing the central portion of the semiconductor wafer W.

Further, the halogen lamps HL in the upper row and the halogen lamps HL in the lower row are configured so as to intersect with each other at right angles. In other words, the 40 halogen lamps HL in total are so arranged that the direction along the lengths of the halogen lamps HL in the upper row and the direction along the lengths of the halogen lamps HL in the lower row are orthogonal to each other.

Each halogen lamp HL is a filament-type light source that passes current through a filament disposed in a glass tube to make the filament incandescent, thereby emitting light. Inside the glass tube is sealed a gas prepared by introducing trace amounts of a halogen element (such as iodine or bromine) into an inert gas such as nitrogen or argon. The introduction of the halogen element allows the temperature of the filament to be set at a high temperature while suppressing a possible break in the filament. The halogen lamps HL thus have the properties of having a longer life than conventional incandescent lamps and being capable of continuously emitting intense light.

The heat treatment apparatus 1 further includes the shutter mechanism 2 provided on one side of the halogen heating part 4 and the chamber 6. The shutter mechanism 2 includes a shutter plate 21 and a slide-drive mechanism 22. The slide-drive mechanism 22 slide-moves the shutter plate 21 in the horizontal direction. When the slide-drive mechanism 22 moves the shutter plate 21 forward, the shutter plate 21 is inserted into a gap between the chamber 6 and the halogen heating part 4 to make the blockage between the lower chamber window 64 and the plurality of halogen lamps HL. This shuts off the light emitted from the plurality of halogen lamps HL toward the heat treatment space 65. Conversely, when the slide-drive mechanism 22 moves the shutter plate 21 backward, the shutter plate 21 is moved out of the gap between the chamber 6 and the halogen heating part 4 so that the underside of the lower chamber window 64 is opened up.

The shutter plate 21 has a small hole (not shown) formed therethrough. When the shutter plate 21 is moved forward to cover over the entire lower chamber window 64, this small hole is located immediately above the probe 49. Thus, even if the shutter plate 21 makes the blockage between the lower chamber window 64 and the plurality of halogen lamps HL, the probe 49 is capable of measuring the temperature of a semiconductor wafer W.

The controller 3 controls the aforementioned various operating mechanisms provided in the heat treatment apparatus 1. The controller 3 is similar in hardware construction to typical computers. Specifically, the controller 3 includes a CPU for performing various computations; a ROM or read-only memory for storing basic programs therein, a RAM or readable and writable memory for storing various pieces of information; and a magnetic disk for storing control software, data, and the like therein.

The heat treatment apparatus 1 further includes, in addition to the aforementioned components, various cooling structures to prevent an excessive temperature rise in the halogen heating part 4, the flash heating part 5, and the chamber 6 due to the heat energy generated from the halogen lamps HL and the flash lamps FL during the heat treatment of a semiconductor wafer W. As an example, a water cooling tube (not shown) is provided in the wall of the chamber 6. The halogen heating part 4 and the flash heating part 5 have an air cooling structure for forming a gas flow therein to exhaust heat. Further, air is supplied into a gap between the upper chamber window 63 and the lamp-light radiation window 53 to cool down the flash heating part 5 and the upper chamber window 63.

Figure 8:
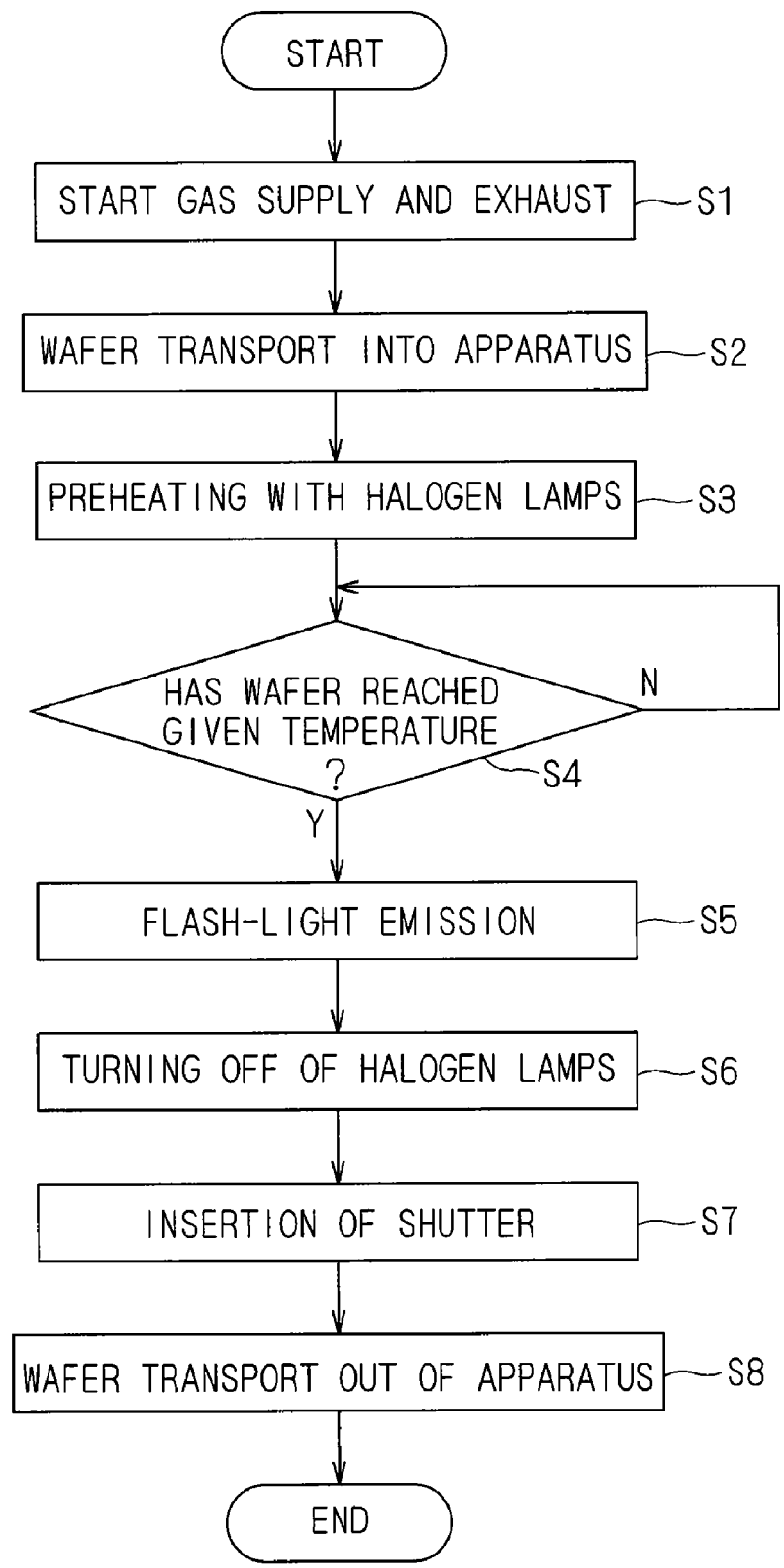
FIG. 8 is a flowchart showing a procedure for processing a semiconductor wafer in the heat treatment apparatus in FIG. 1.

Next, a procedure for treating a semiconductor wafer W in the heat treatment apparatus 1 is described briefly. A semiconductor wafer W to be treated herein is a semiconductor substrate doped with impurities (ions) by ion implantation. The implanted impurities is activated by flash heating in the heat treatment apparatus 1. FIG. 8 is a flow chart showing the procedure for treating a semiconductor wafer W in the heat treatment apparatus 1. The procedure for treating a semiconductor wafer W described below is executed by the controller 3 controlling each operating mechanism in the heat treatment apparatus 1.

First, the valve 84 for use in gas supply and the valves 89, 92, and 94 for use in gas exhaustion are opened to start the supply and exhaust of a gas into and out of the chamber 6 (step S1). When the valve 84 is opened, a nitrogen gas is supplied uniformly to the heat treatment space 65 from the entire circumference of the annular slit 81 formed in the space between the upper chamber window 63 and the upper end of the inner wall of the chamber 6. When the valve 89 is opened, a gas in the chamber 6 is exhausted uniformly from the entire circumference of the annular slit 86 formed in the space between the lower chamber window 64 and the lower end of the inner wall of the chamber 6. Thereby the nitrogen gas supplied from the uppermost part of the heat treatment space 65 in the chamber 6 flows downward through the side of the semiconductor wafer W held by the holding part 7 and is exhausted from the undermost part of the heat treatment space 65. There are large open gaps of the lugs 72 on the side of the semiconductor wafer W, from which gaps the nitrogen gas flows downward.

When the valves 92 and 94 are opened, the gas in the chamber 6 is exhausted respectively through the transport opening 66 and the periphery of the driver of the transfer mechanism 10. Thereby the nitrogen gas supplied from the uppermost part of the heat treatment space 65 in the chamber 6 is exhausted through the transport opening 66 and the periphery of the driver of the transfer mechanism 10. The nitrogen gas is continuously supplied into the heat treatment space 65 during the heat treatment of the semiconductor wafer W in the heat treatment apparatus 1, and the amount of the nitrogen gas supplied into the heat treatment space 65 is changed as appropriate in accordance with the processing steps in FIG. 8.

Subsequently, the gate valve 185 is opened to open the transport opening 66, and a transport robot outside the heat treatment apparatus 1 transports the ion-implanted semiconductor wafer W through the transport opening 66 into the heat treatment space 65 in the chamber 6 (in step S2). The semiconductor wafer W transported by the transport robot is moved to and stopped at the position immediately above the holding part 7. Then, the pair of transfer arms 11 of the transfer mechanism 10 are moved horizontally and upwardly from their retracted positions to their transfer positions, whereby the lift pins 12 protrude above the soaking ring 75 through the inside of the soaking ring 75 to receive the semiconductor wafer W from the transport robot.

After the semiconductor wafer W is placed on the lift pins 12, the transport robot moves out of the heat treatment space 65, and the transport opening 66 is closed by the gate valve 185. The pair of transfer arms 11 are then moved downwardly, so that the semiconductor wafer W is transferred from the transfer mechanism 10 to the soaking ring 75 and then held in a horizontal position. The pair of transfer arms 11 moved down to under the soaking ring 75 are moved by the horizontal movement mechanism 13 to their retracted positions, i.e., retracted into the interior space of the recessed portion 62.

After the semiconductor wafer W is held by the soaking ring 75 of the holding part 7, the 40 halogen lamps HL turn on simultaneously to start preheating (or assist-heating) (in step S3). The halogen light emitted from the halogen lamps HL passes through the lower chamber window 64 of quartz to irradiate the underside of the semiconductor wafer W. The semiconductor wafer W irradiated with the light from the halogen lamps HL is preheated so that its temperature increases.

At the preheating stage, the peripheral portion of the semiconductor wafer W in which heat radiation is more likely to occur tends to have a lower temperature than the central portion. However, because the soaking ring 75 compensates for the heat radiation in the peripheral portion, the in-plane temperature distribution in the semiconductor wafer W can be maintained uniform. Besides, since the halogen lamps HL in the halogen heating part 4 are disposed at a higher density in the region opposed to the peripheral portion of the semiconductor wafer W than in the region opposed to the central portion of the semiconductor wafer W, a greater amount of light is emitted to the peripheral portion of the semiconductor wafer W in which heat radiation is more likely to occur. This makes more uniform the in-plane temperature distribution in the semiconductor wafer W at the preheating stage.

Further, since the reflecting ring 69 mounted to the chamber side portion 61 has a tapered surface that extends toward the holding part 7 and that is a nickel-plated mirror surface, this tapered surface of the reflecting ring 69 reflects a greater amount of light toward the peripheral portion of the semiconductor wafer W. This makes more uniform the in-plane temperature distribution in the semiconductor wafer W at the preheating stage.

During the preheating, the temperature of the semiconductor wafer W is measured with the contact-type thermometer and the radiation thermometer. Specifically, the probe 78 of the contact-type thermometer is brought in contact with the underside of the semiconductor wafer W, and the probes 49 and 79 of the radiation thermometer receive radiation from the underside of the semiconductor wafer W. Those three probes 49, 78, and 79 monitor whether the temperature of the semiconductor wafer W reaches a given preheating temperature T1 or not (in step S4).

In the present preferred embodiment, the preheating temperature T1 shall be 800° C. Immediately after the temperature of the semiconductor wafer W reaching the preheating temperature T1 is detected, the flash lamps FL in the flash heating part 5 emit flash light toward the semiconductor wafer W (in step S5). At this time, part of the flash light emitted from the flash lamps FL travels directly toward the holding part 7 in the heat treatment space 65, whereas the remainder of the flash light is once reflected by the reflector 52 and then travels into the heat treatment space 65. Such flash-light emission causes the flash heating of the semiconductor wafer W. The flash heating by the flash-light emission from the flash lamps FL leads to a short-time increase in the surface temperature of the semiconductor wafer W.

Specifically, the flash light emitted from the flash lamps FL in the flash heating part 5 is intense flash light obtained by conversion of the previously stored electrostatic energy into an ultrashort light pulse and emitted for an extremely short period of time ranging from about 0.1 millisecond to about 10 milliseconds. The surface temperature of the semiconductor wafer W subjected to the flash heating by the flash-light emission from the flash lamps FL rises momentarily to a processing temperature T2 of the order of 1000° C. to 1100° C. After the impurities implanted in the semiconductor wafer W are activated, the surface temperature of the semiconductor wafer W decreases rapidly. Because of its capability of increasing and decreasing the surface temperature of the semiconductor wafer W in an extremely short time, the heat treatment apparatus 1 can achieve the activation of impurities implanted in the semiconductor wafer W while suppressing diffusion of those impurities due to heat. Since the time required for the activation of the implanted impurities is extremely short as compared to the time required for the thermal diffusion of the implanted impurities, the activation is completed in such a short time that no diffusion occurs, the time ranging from about 0.1 millisecond to about 10 milliseconds.

In the heat treatment apparatus 1 according to the present preferred embodiment, the semiconductor wafer W is first preheated by the halogen lamps HL up to the preheating temperature T1 (800° C.) and then flash-heated by the flash-light emission from the flash lamps FL. When the temperature of the semiconductor wafer W reaches 600° C. or higher, there is a possibility of thermal diffusion of the implanted impurities. However, because the halogen lamps HL can relatively rapidly raise the temperature of the semiconductor wafer W up to 800° C., the heat treatment apparatus 1 can minimize the thermal diffusion of the implanted impurities. Also, since the semiconductor wafer W is firstly preheated to the preheating temperature T1 and is secondly irradiated with the flash light emitted from the flash lamps FL, the surface temperature of the semiconductor wafer W can rapidly be increased up to the treatment temperature T2. In addition, because the temperature increase by the flash heating from the preheating temperature T1 to the treatment temperature T2 is relatively small, the energy of the flash light emitted from the flash lamps FL can also be relatively small. This results in a reduction in the thermal shock given to the semiconductor wafer W during the flash heating.

After a lapse of given time since the completion of the flash heating, the plurality of halogen lamps HL turn off simultaneously so that the temperature of the semiconductor wafer W decreases rapidly (in step S6). Simultaneously with the turning off of the halogen lamps HL, the shutter mechanism 2 inserts the shutter plate 21 between the halogen heating part 4 and the chamber 6 (in step S7). Since the temperatures of the filaments and the tube walls usually do not drop immediately after the turning off of the halogen lamps HL, the filaments and the tube walls which are still at high transient temperatures continue to radiate radiant heat This obstructs a decrease in the temperature of the semiconductor wafer W. The insertion of the shutter plate 21 shuts off the radiant heat radiated from the just-turned-off halogen lamps HL to the heat treatment space 65, thereby increasing the rate of decrease in the temperature of the semiconductor wafer W.

Also at the stage of decreasing the temperature of the semiconductor wafer W, the three probes 49, 78, and 79 measure the temperature of the semiconductor wafer W. Since, as previously described, the shutter plate 21 has a small hole formed therethrough, the probe 49 is capable of measuring the temperature, even with the shutter plate 21 inserted between the probe 49 and the semiconductor wafer W. Besides, the insertion of the shutter plate 21 shuts off the radiant heat radiated from the just-turned-off halogen lamps HL. This reduces disturbances given to the probe 79 of the radiation thermometer, thereby increasing the accuracy of the temperature measurement.

Thereafter, after the temperature of the semiconductor wafer W decreases to a given temperature or lower, the pair of transfer arms 11 of the transfer mechanism 10 are moved again horizontally and upwardly from their retracted positions to their transfer positions, whereby the lift pins 12 protrude above the soaking ring 75 through the inside of the soaking ring 75 to receive the heat-treated semiconductor wafer W from the holding part 7. Subsequently, the transport opening 66 which has been closed is opened by the gate valve 185, and the semiconductor wafer W placed on the lift pins 12 is transported to the outside by the transport robot outside the apparatus (in step S8). This completes the flash heating of the semiconductor wafer W in the heat treatment apparatus 1.

In the heat treatment apparatus 1 according to the present preferred embodiment, the annular recessed portion 62 which surrounds the periphery of the holding part 7 is formed in the horizontal direction in the inner wall surface of the chamber 6. The width H1 of the recessed portion 62 in the vertical direction is greater than the width H2 of the transport opening 66 in the vertical direction, and the outer peripheral surface of the recessed portion 62 communicates with the transport opening 66. The formation of this recessed portion 62 prevents reflections in the inner wall of the chamber 6 evenly around the periphery of the holding part 7. In other words, in the absence of the recessed portion 62, reflections are prevented only at the transport opening 66 where no wall surface exists, whereas in the presence of the recessed portion 62, there exists no wall surface that reflects light, around the entire circumference of the holding part 7. The light emitted from the halogen lamps HL and the flash lamps FL can thus be prevented from being reflected non-uniformly in the inner wall surface of the chamber 6 to enter the semiconductor wafer W. This improves the uniformity of the in-plane temperature distribution in the semiconductor wafer W during heat treatment.

The heat treatment apparatus 1 also has the reflecting rings 68 and 69 removably mounted on the upper and lower sides of the inner wall surface of the chamber side portion 61. Both the reflecting rings 68 and 69 have a tapered surface that extends toward the holding part 7 and that is a nickel-plated mirror surface. The light emitted from the halogen lamps HL and the flash lamps FL is thus reflected off the tapered surfaces of the reflecting rings 68 and 69, whereby more light enters the peripheral portion of the semiconductor wafer W where the temperature is likely to decrease at the preheating stage. This results in a further improvement in the uniformity of the in-plane temperature distribution in the semiconductor wafer W during heat treatment.

Since the reflecting rings 68 and 69 are removably mounted to the chamber side portion 61, they can be readily removed during the maintenance of the chamber 6. This facilitates the installation of the holding part 7 and operations performed on the transfer mechanism 10.

During the heat treatment, the pair of transfer arms 11 of the transfer mechanism 10 are at their retracted positions within the interior space of the recessed portion 62 of the chamber 6. The recessed portion 62 also has provided therein the susceptor 70, and the probes 78 and 79 for temperature measurement. That is, various constructions as much as possible are housed in the recessed portion 62. This minimizes the risk that the transfer arms 11 and the probes 78 and 79 may obstruct the light coming from the halogen lamps HL and the flash lamps FL, thus making more uniform the in-plane temperature distribution in the semiconductor wafer W during the heat treatment. Besides, the light coming from the halogen lamps HL and the flash lamps FL does not directly reach the interior space of the recessed portion 62. This further prevents the transfer arms 11 and the probes 78 and 79 from being damaged by the intense flash-light emission from the flash lamps FL.

While the preferred embodiment according to the invention has been described so far, various modifications of the invention in addition to those described above may be made without departing from the scope and spirit of the invention. For example, while both the upper reflecting ring 68 and the lower reflecting ring 69 have a tapered surface in the aforementioned preferred embodiment, only either of them may have a tapered surface. In that case, it is preferable that the lower reflecting ring 69 should have a tapered surface. This allows more light from the halogen lamps HL to enter the peripheral portion of the semiconductor wafer W in which the temperature is likely to decrease at the preheating stage, thus improving the uniformity of the in-plane temperature distribution in the semiconductor wafer W during the preheating.

While the processing gas supplied to the heat treatment space 65 is a nitrogen gas ($N_2$) in the present preferred embodiment, the present invention is not limited thereto. For example, cleaned air; an inert gas such as an helium (He) or argon (Ar) gas; or an oxygen ($O_2$) gas may be used. It is however noted that the processing gas preferably be an inert gas such as nitrogen, helium, or argon, and more preferably be a nitrogen gas in cost terms, because the semiconductor wafer W is heated in the heat treatment space 65 to a temperature of as high as several hundred degrees to 1000° C. or higher.

In the above-mentioned preferred embodiment, when the temperature of the semiconductor wafer W reaches the preheating temperature T1, the flash lamps FL start emitting flash light, even with the halogen lamps HL still remaining on. However, the timing of the flash heating is not limited only thereto. For example, after the temperature of the semiconductor wafer W is raised by the halogen lamps HL to exceed the preheating temperature T1, the halogen lamps HL may be turned off and the shutter plate 21 may be inserted, so that the flash-light emission starts at the time when the temperature of the semiconductor wafer W decreases down to the preheating temperature T1.

Although the flash heating part 5 includes the 30 flash lamps FL in the aforementioned preferred embodiment, the present invention is not limited only thereto. The number of flash lamps FL may be any arbitrary number. Further, the flash lamps FL are not limited to xenon flash lamps, but may be krypton flash lamps. The number of halogen lamps HL provided in the halogen heating part 4 is also not limited to 40, but may be any arbitrary number.

In the aforementioned preferred embodiment, the flash lamps FL are located above the chamber 6 and the halogen lamps HL below the chamber 6. The present invention is applicable not only to such an apparatus but also to an apparatus that includes a chamber window both above and below the chamber to irradiate a semiconductor wafer W with light from both sides of the semiconductor wafer W. For example, the present invention is also applicable to a heat treatment apparatus with halogen lamps HL provided both above and below the chamber 6.

In the aforementioned preferred embodiment, the ion activation is performed by irradiating a semiconductor wafer with light. The substrate to be treated by the heat treatment apparatus according to the present invention is not limited only to a semiconductor wafer. For example, the heat treatment apparatus according to the present invention may treat a glass substrate formed of various silicon films including a silicon nitride film, a polycrystalline silicon film, and the like. As an example, silicon ions are implanted into a polycrystalline silicon film formed on a glass substrate by CVD to form an amorphous silicon film, and a silicon oxide film serving as an anti-reflection film is formed on the amorphous silicon film. In this state, the heat treatment apparatus according to the present invention may irradiate the entire surface of the amorphous silicon film with light to polycrystallize the amorphous silicon film, thereby forming a polycrystalline silicon film.

As another alternative, a TFT substrate may be prepared such that an underlying silicon oxide film and a polysilicon film produced by crystallizing amorphous silicon are formed on a glass substrate and the polysilicon film is doped with impurities such as phosphorus or boron. Then, the heat treatment apparatus according to the present invention may irradiate the TFT substrate with light to activate the impurities implanted by the impurity doping.

While the invention has been shown and described in detail, the foregoing description is in all aspects illustrative and not restrictive. It is therefore understood that numerous modifications and variations can be devised without departing from the scope of the invention.

What is claimed is:

1. A heat treatment apparatus for heating a substrate by light irradiation, comprising:
   a chamber having a tube-like inner wall with upper and lower openings;
   a holding part for holding a substrate in a horizontal position within said chamber;
   a first light-irradiation part provided on the upper side of said chamber and for irradiating the substrate held by said holding part with light;
   a second light-irradiation part provided on the lower side of said chamber and for irradiating the substrate held by said holding part with light;
   a first chamber window for closing the upper opening of said chamber and allowing the light emitted from said first light-irradiation part to pass through into said chamber;
   a second chamber window for closing the lower opening of said chamber and allowing the light emitted from said second light-irradiation part to pass through into said chamber; and
   a transport opening formed in the side wall of said chamber and for transporting a substrate into and out of said chamber,
   wherein an annular recessed portion is horizontally formed in the inner wall surface of said chamber to surround the periphery of said holding part, said recessed portion having a greater width in a vertical direction than said transport opening, and
   said transport opening communicates with the outer peripheral surface of said recessed portion.

2. The heat treatment apparatus according to claim 1, wherein
   said recessed portion has a width of 20 mm to 100 mm.

3. The heat treatment apparatus according to claim 1, further comprising:
   two annular reflecting barrier plates, the inner peripheral surfaces of which are mirror surfaces,
   said two reflecting barrier plates being removably mounted on the upper and lower sides of the inner side wall of said chamber with said recessed portion therebetween.

4. The heat treatment apparatus according to claim 3, wherein
   at least either of said two reflecting barrier plates mounted on the upper and lower sides of said recessed portion has a tapered inner peripheral surface extending toward said holding part.

5. The heat treatment apparatus according to claim 3, wherein
   the inner peripheral surfaces of said two reflecting barrier plates are nickel-plated mirror surfaces.

6. The heat treatment apparatus according to claim 1, further comprising
   a transfer part including:
   a pair of transfer arms with an upright support pin;
   a horizontal movement part for horizontally moving said pair of transfer arms between a transfer position from which a substrate is transferred to said holding part, and a retracted position that does not overlap the substrate held by said holding part in plan view; and
   a vertical movement part for vertically moving said pair of transfer arms up and down at said transfer position to transfer a substrate to said holding part,
   wherein said retracted position is situated within the interior space of said recessed portion.

7. The heat treatment apparatus according to claim 6, further comprising:
   a temperature measurement part provided within the interior space of said recessed portion and for measuring the temperature of the substrate held by said holding part.

8. The heat treatment apparatus according to claim 1, wherein
   said first light-irradiation part includes a flash lamp, and said second light-irradiation part includes a halogen lamp.

* * * * *